US006838114B2

(12) United States Patent
Carpenter et al.

(10) Patent No.: US 6,838,114 B2
(45) Date of Patent: Jan. 4, 2005

(54) METHODS FOR CONTROLLING GAS PULSING IN PROCESSES FOR DEPOSITING MATERIALS ONTO MICRO-DEVICE WORKPIECES

(75) Inventors: Craig M. Carpenter, Boise, ID (US); Ross S. Dando, Nampa, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 10/155,547

(22) Filed: May 24, 2002

(65) Prior Publication Data

US 2003/0219528 A1 Nov. 27, 2003

(51) Int. Cl.[7] .............................................. C23C 16/00
(52) U.S. Cl. ........................... 427/8; 427/96; 427/248.1
(58) Field of Search .......................... 427/8, 96, 248.1, 427/255.11

(56) References Cited

U.S. PATENT DOCUMENTS

| | | | |
|---|---|---|---|
| 5,131,752 A | 7/1992 | Yu et al. | |
| 5,200,023 A | 4/1993 | Gifford et al. | |
| 5,377,429 A | 1/1995 | Sandhu et al. | |
| 5,480,818 A | 1/1996 | Matsumoto et al. | |
| 5,788,778 A | 8/1998 | Shang et al. | |
| 5,851,849 A | 12/1998 | Comizzoli et al. | |
| 5,879,459 A | 3/1999 | Gadgil et al. | |
| 5,908,947 A | 6/1999 | Vaartstra | |
| 5,932,286 A | 8/1999 | Beinglass et al. | |
| 5,968,587 A | * 10/1999 | Frankel ......................... | 427/8 |
| 5,972,430 A | 10/1999 | DiMeo, Jr. et al. | |
| 6,042,652 A | 3/2000 | Hyun et al. | |
| 6,079,426 A | 6/2000 | Subrahmanyam et al. | |
| 6,109,206 A | 8/2000 | Maydan et al. | |
| 6,139,700 A | 10/2000 | Kang et al. | |
| 6,143,659 A | 11/2000 | Leem | |
| 6,144,060 A | 11/2000 | Park et al. | |
| 6,174,377 B1 | 1/2001 | Doering et al. | |
| 6,174,809 B1 | 1/2001 | Kang et al. | |
| 6,203,613 B1 | 3/2001 | Gates et al. | |
| 6,237,529 B1 | 5/2001 | Spahn | |
| 6,270,572 B1 | 8/2001 | Kim et al. | |
| 6,287,965 B1 | 9/2001 | Kang et al. | |
| 6,297,539 B1 | 10/2001 | Ma et al. | |
| 6,305,314 B1 | 10/2001 | Sneh et al. | |
| 6,329,297 B1 | 12/2001 | Balish et al. | |
| 6,342,277 B1 | 1/2002 | Sherman | |
| 6,346,477 B1 | 2/2002 | Kaloyeros et al. | |
| 6,374,831 B1 | 4/2002 | Chandran et al. | |
| 6,387,185 B2 | 5/2002 | Doering et al. | |
| 6,387,207 B1 | 5/2002 | Janakiraman et al. | |
| 6,428,859 B1 | 8/2002 | Chiang et al. | |
| 6,450,117 B1 | 9/2002 | Murugesh et al. | |
| 6,451,119 B2 | 9/2002 | Sneh et al. | |

(List continued on next page.)

FOREIGN PATENT DOCUMENTS

| | | |
|---|---|---|
| JP | 4-213818 A | 8/1992 |
| WO | WO 99/06610 A1 | 2/1999 |
| WO | WO 00/40772 A1 | 7/2000 |
| WO | WO 00/79019 A1 | 12/2000 |
| WO | WO 02/45871 A1 | 6/2002 |
| WO | WO 02/073329 A2 | 9/2002 |
| WO | WO 03/008662 A2 A3 | 1/2003 |
| WO | WO 03/016587 A1 | 2/2003 |
| WO | WO 03/033762 A1 | 4/2003 |
| WO | WO 03/035927 A2 | 5/2003 |

OTHER PUBLICATIONS

U.S. Appl. No. 09/805,620, Carpenter et al., filed Mar. 13, 2001.
U.S. Appl. No. 09/810,387, Carpenter et al., filed Mar. 15, 2001.
UC Berkeley Extension, Engineering, "Atomic Layer Deposition," Dec. 11, 2001, 5 pages, http://www.unex.berkeley.edu/eng/br335/I–I.html.
IPS Integrated Process Systems, Dec. 11, 2001, 1 page, http://www.ips–tech.com/eng/main.htm.
IPS Integrated Process Systems, Nano–ALD, Dec. 11, 2001, 2 pages, http://www.ips–tech.com/eng/pro–p2.htm.
Deublin Company, Precision Rotating Unions, Stream Joints and Siphon Systems "Precision Rotating Connections for Water, Steam, Air, Hydraulic, Vacuum, Coolant and Hot Oil Service," http://www.deublin.com, Feb. 4, 2002, 1 page.
Deublin Company, "Rotating Unions," http://www.deublin.com/products/rotatingunions.htm, Feb. 4, 2002, 1 page.
Deublin Company, "Sealing," http://www.deublin.com/products/sealing.htm, Feb. 4, 2002, 2 pages.
Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.
The University of Adelaide Australia, Department of Chemistry, Stage 2 Chemistry Social Relevance Projects, "Spectroscopy," 2 pages, Feb. 9, 2002. http://www.chemistry.adelaide.edu.au/external/Soc–Rel/content/Spectros.htm.

Primary Examiner—Bret Chen
(74) Attorney, Agent, or Firm—Perkins Coie LLP

(57) ABSTRACT

Methods for depositing materials onto micro-device workpieces in a reaction chamber. One embodiment of such a method comprises providing a flow of a first precursor through the reaction chamber to deposit the first precursor onto the micro-device workpiece in the reaction chamber, and providing a flow of a purge gas through the reaction chamber to purge excess amounts of the first precursor. The method continues by monitoring a parameter correlated to a quantity of the first precursor and/or the purge gas in the reaction chamber as the first precursor and/or the purge gas flows through the reaction chamber. An additional aspect of this method is terminating the flow of the first precursor and/or the flow of the purge gas based on the monitored parameter of the quantity of the first precursor and/or the purge gas. The procedure of monitoring a parameter correlated to a quantity of the first precursor and/or the purge gas can comprise determining a concentration of the first precursor and/or the purge gas in the reaction chamber using a selected radiation.

38 Claims, 5 Drawing Sheets

U.S. PATENT DOCUMENTS

| | | |
|---|---|---|
| 6,461,436 B1 | 10/2002 | Campbell et al. |
| 6,503,330 B1 | 1/2003 | Sneh et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,540,838 B2 | 4/2003 | Sneh et al. |
| 6,551,929 B1 * | 4/2003 | Kori et al. .................. 438/685 |
| 6,562,140 B1 | 5/2003 | Bondestam et al. |
| 6,573,184 B2 | 6/2003 | Park |
| 6,579,372 B2 | 6/2003 | Park |
| 6,579,374 B2 | 6/2003 | Bondestam et al. |
| 6,630,201 B2 * | 10/2003 | Chiang et al. ......... 427/255.28 |
| 6,635,965 B1 | 10/2003 | Lee et al. |
| 6,638,879 B2 | 10/2003 | Hsieh et al. |
| 2001/0011526 A1 | 8/2001 | Doering et al. |
| 2001/0045187 A1 | 11/2001 | Uhlenbrock |
| 2002/0007790 A1 | 1/2002 | Park |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0127745 A1 | 9/2002 | Lu et al. |
| 2002/0144655 A1 | 10/2002 | Chiang et al. |
| 2002/0162506 A1 | 11/2002 | Sneh et al. |
| 2002/0164420 A1 | 11/2002 | Derderian et al. |
| 2002/0195056 A1 | 12/2002 | Sandhu et al. |
| 2002/0197402 A1 | 12/2002 | Chiang et al. |
| 2003/0023338 A1 | 1/2003 | Chin et al. |
| 2003/0027428 A1 | 2/2003 | Ng et al. |
| 2003/0027431 A1 | 2/2003 | Sneh et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |

* cited by examiner

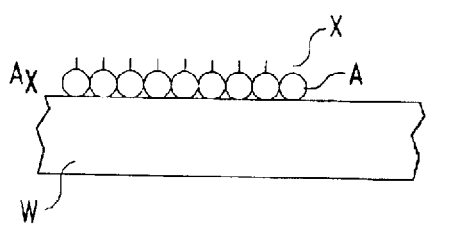
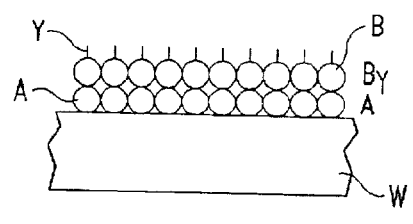
Fig. 1A
(Prior Art)
Fig. 1B
(Prior Art)
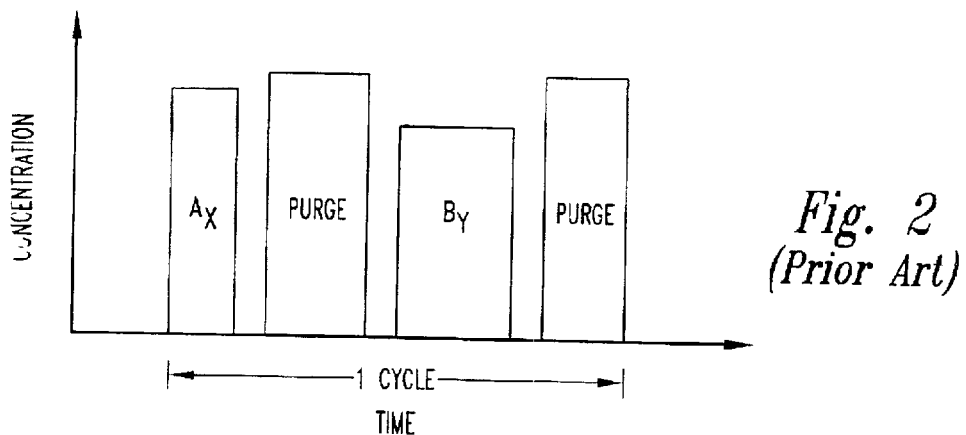
Fig. 2
(Prior Art)
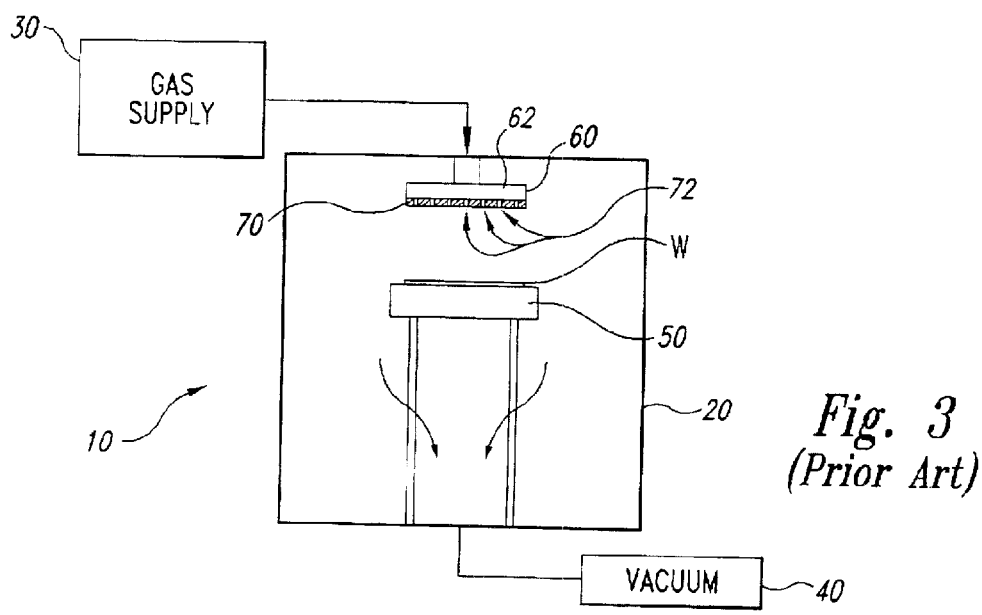
Fig. 3
(Prior Art)

METHODS FOR CONTROLLING GAS PULSING IN PROCESSES FOR DEPOSITING MATERIALS ONTO MICRO-DEVICE WORKPIECES

TECHNICAL FIELD

The present invention is related to apparatus and methods for controlling gas pulsing in thin film deposition processes used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) is increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. The most common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials that are already formed on the workpiece. Implanted or doped materials, for example, can migrate in the silicon substrate at higher temperatures. On the other hand, if more reactive precursors are used so that the workpiece temperature can be lower, then reactions may occur prematurely in the gas phase before reaching the substrate. This is not desirable because the film quality and uniformity may suffer, and also because it limits the types of precursors that can be used. Thus, CVD techniques may not be appropriate for many thin film applications.

Atomic Layer Deposition (ALD) is another thin film deposition technique that addresses several of the drawbacks associated with CVD techniques. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin solid layer of material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

FIG. 3 schematically illustrates an ALD reactor 10 having a chamber 20 coupled to a gas supply 30 and a vacuum 40. The reactor 10 also includes a heater 50 that supports the workpiece W and a gas dispenser 60 in the chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the chamber 20.

One drawback of ALD processing is that it has a relatively low throughput compared to CVD techniques. For example, ALD processing typically takes about eight to eleven seconds to perform each $A_x$-purge-$B_y$-purge cycle. This results in a total process time of approximately eight to eleven minutes to form a single thin layer of only 60 Å. In contrast to ALD processing, CVD techniques only require about one minute to form a 60 Å thick layer. The low throughput of existing ALD techniques limits the utility of the technology in its current state because ALD may be a bottleneck in the overall manufacturing process. Thus, it would be useful to increase the throughput of ALD techniques so that they can be used in a wider range of applications.

Another drawback of ALD processing is that it is difficult to control the uniformity of the deposited films over a long period of time. One reason that it is difficult to consistently deposit uniform films is that the first precursor $A_x$ and/or the second precursor $B_y$ may ad sorb onto the surfaces of the reaction chamber 20. This may cause a build up of the first and second precursors that produces a layer of the deposited material on the components of the reaction chamber 20. Additionally, when the adsorption of the first precursor and/or the second precursor on the components of the reaction chamber 20 reaches a saturation point, the precursors will then begin to desorp into the gas flows in the reaction chamber 20. Such adsorption and desorption of the precursors affects the quality of the layers of material deposited onto the workpieces. Therefore, there is also a need to provide better control of ALD processing to achieve more consistent results throughout a run of workpieces.

SUMMARY

The present invention is directed toward reactors for depositing materials onto micro-device workpieces, systems that include such reactors, and methods for depositing materials onto micro-device workpieces. In one embodiment, an apparatus for depositing materials onto a micro-device workpiece includes a gas source system configured to provide a first precursor, a second precursor, and a purge gas. The apparatus can also include a valve assembly coupled to the gas source system. The valve assembly is configured to control a flow of the first precursor, a flow the second precursor, and a flow of the purge gas. Another component of the apparatus is a reaction chamber including an inlet coupled to the valve assembly, a workpiece holder in the reaction chamber, and an outlet downstream from the workpiece holder. The apparatus also includes a monitoring system and a controller. The monitoring system comprises a radiation source that directs a selected radiation through the gas flow and a detector that senses a parameter of the radiation. The controller is operatively coupled to the monitoring system and the valve assembly. The controller contains computer operable instructions to terminate the flow of the first precursor, the flow of the second precursor and/or the flow of the purge gas based on the parameter sensed by the monitoring system in real-time during a deposition cycle of a workpiece.

The monitoring system can have several different embodiments. In one embodiment, the monitoring system comprises a radiation source that directs the selected radiation through the reaction chamber between the inlet of the reaction chamber and the workpiece holder. In another embodiment, the monitoring system comprises a radiation source that directs the selected radiation through the reaction chamber downstream from the workpiece holder. For example, the monitoring system can include a radiation source that directs radiation to a reflector within the reaction chamber that is immediately downstream from the workpiece, and the detector can be positioned to receive the radiation returning from the reflector. In another example, the radiation source can direct the radiation through the outlet flow, and the detector can be positioned to receive the radiation passing through the outlet flow.

The monitoring system can be a spectroscope that measures the radiation absorbed by the first precursor, the second precursor, and/or the purge gas. It will be appreciated that several different wavelengths of radiation can be directed through the reaction chamber to determine the concentration of each of the first precursor, the second precursor and the purge gas at different times throughout the $A_x$-purge-$B_y$-purge cycle. The monitoring system, therefore, can generally comprise a radiation source that directs a selected radiation through the reaction chamber and detector that senses a parameter of the radiation correlated to a quantity of the precursor and/or the purge gas in the reaction chamber.

The apparatus can be used to perform several methods for depositing materials onto the micro-device workpieces. In one embodiment, a method includes providing a flow of a first precursor through the reaction chamber to deposit the first precursor onto a micro-device workpiece, and subsequently providing a flow of a purge gas through the reaction chamber to purge excess amounts of the first precursor. This embodiment can further include monitoring a parameter correlated to a quantity of the first precursor and/or the purge gas in the reaction chamber as the first precursor and/or the purge gas flow through the reaction chamber. The flow of the first precursor and/or the flow of the purge gas is then terminated based upon the quantity of the first precursor and/or the purge gas in real-time. Different embodiments of this method can be used to determine when a sufficient amount of one of the precursors is in the reaction chamber to reach a desired saturation point. This is expected to provide a more accurate dosing of the precursors in the reaction chamber to compensate for adsorption/desorption of the precursors. Additional embodiments of this method include terminating the purge cycle according to the increased level of the purge gas and/or the decreased level of the antecedent precursor. This is expected to more accurately define the length of the purge pulses in a manner that enhances the consistency of ALD processing and reduces the length of the purge pulses.

BRIEF DESCRIPTION OF THE DRAWINGS

FIGS. 1A and 1B are schematic cross-sectional views of stages in atomic layer deposition processing in accordance with the prior art.

FIG. 2 is a graph illustrating a cycle for forming a layer using atomic layer deposition in accordance with the prior art.

FIG. 3 is a schematic representation of a system including a reactor for vapor deposition of a material on to a microelectronic workpiece in accordance with the prior art.

DETAILED DESCRIPTION

The following disclosure is directed toward reactors for depositing a material onto a micro-device workpiece, systems including such reactors, and methods for depositing a material onto a micro-device workpiece. Many specific details of the invention are described below with reference to depositing materials onto micro-device workpieces. The term "micro-device workpiece" is used throughout to include substrates upon which and/or in which microelectronic devices, micromechanical devices, data storage elements, and other features are fabricated. For example, micro-device workpieces can be semi-conductor wafers, glass substrates, insulative substrates, or many other types of substrates. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Additionally, several aspects of the invention are described with respect to Atomic Layer Deposition ("ALD"), but certain aspect may be applicable to other types of deposition processes. Several embodiments in accordance with the invention are set forth in FIGS. 4-8 and the related text to provide a thorough understanding of particular embodiments of the invention. A person skilled in the art will understand, however, that the invention may have additional embodiments, or that the invention may be practiced without several of the details in the embodiments shown in FIGS. 4-8.

A. Deposition Systems

Figure 4:
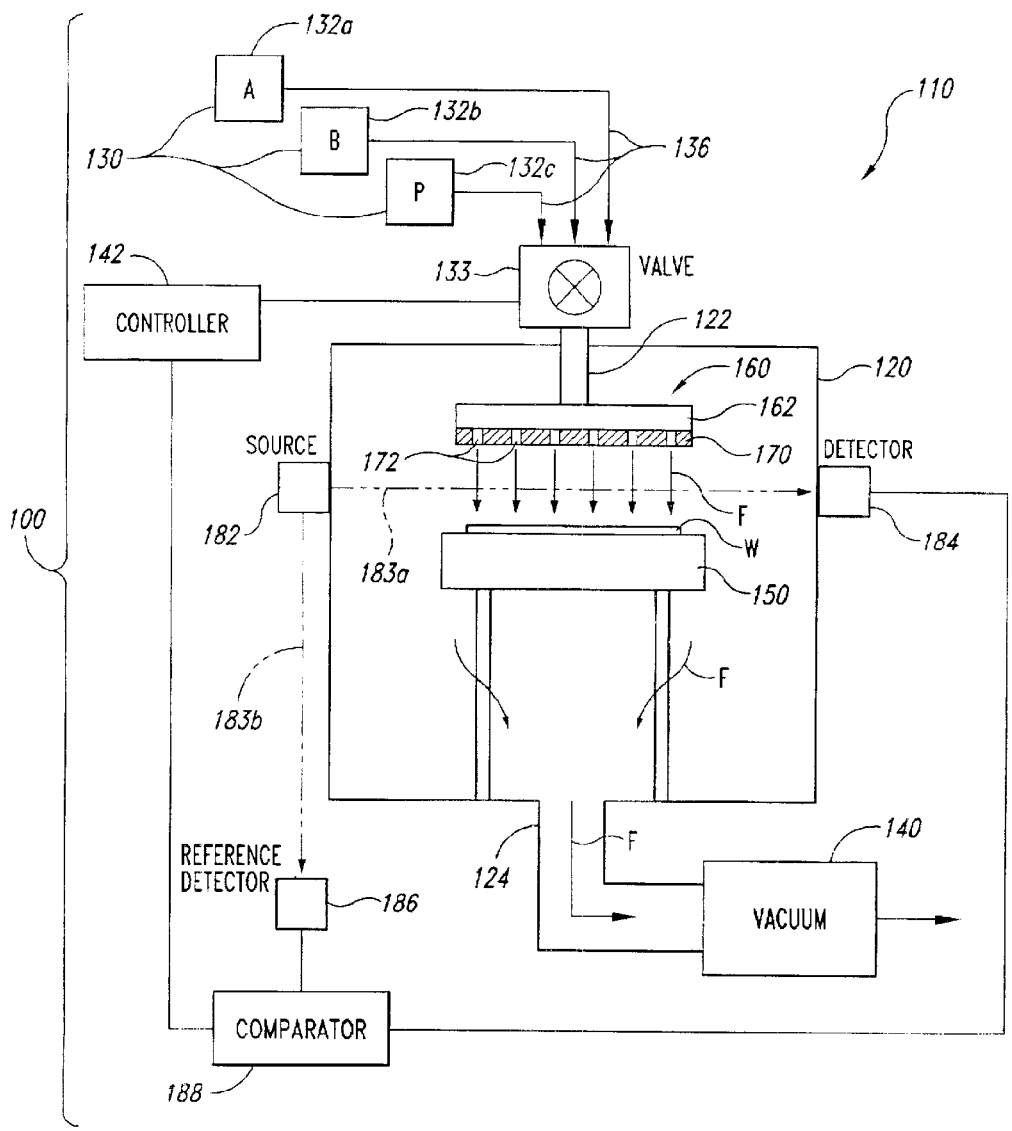
FIG. 4 is a schematic representation of a system having a reactor for depositing a material onto a micro-device workpiece in accordance with one embodiment of the invention.

FIG. 4 is a schematic representation of a system 100 for depositing a material onto a micro-device workpiece W in accordance with an embodiment of the invention. In this embodiment, the system 100 includes a reactor 110 having a reaction chamber 120 coupled to a gas supply 130 and a vacuum 140. For example, the reaction chamber 120 can have an inlet 122 coupled to the gas supply 130 and an outlet 124 coupled to the vacuum 140.

The gas supply 130 includes a plurality of gas sources 132 (identified individually as 132a-c), a valve assembly 133, and a plurality of gas lines 136 coupling the gas sources 132 to the valve assembly 133. The gas sources 132 can include a first gas source 132a for providing a first precursor gas "A," a second gas source 132b for providing a second precursor gas "B," and a third gas source 132c for providing a purge gas "P." The first and second precursors A and B can be the constituents that react to form the thin, solid layer on the workpiece W. The purge gas P can be a type of gas that is compatible with the reaction chamber 120 and the workpiece W. The valve assembly 133 is coupled to a controller 142 that generates signals for pulsing the individual gases through the reaction chamber 120 in a number of cycles. Each cycle can include a first pulse of the first precursor A, a second pulse of the purge gas P, a third pulse of the second precursor B, and a fourth pulse of the purge gas P. As explained in more detail below, several embodiments of the system 100 monitor and control the pulses of the first precursor A, the second precursor B, and/or the purge gas P to provide consistent results and a high throughput.

The reactor 110 in the embodiment illustrated in FIG. 4 also includes a workpiece support 150 and a gas distributor 160 in the reaction chamber 120. The workpiece support 150 can be a plate having a heating element to heat the workpiece W to a desired temperature for catalyzing the reaction between the first precursor A and the second precursor B at the surface of the workpiece W. The workpiece support 150, however, may not be heated in all applications. The gas distributor 160 is coupled to the inlet 122 of the reaction chamber 120. The gas distributor 160 has a compartment or plenum 162 and a distributor plate 170. The distributor plate 170 has a plurality of passageways 172 through which gasses flow into the reaction chamber 120 along a gas flow F.

B. Monitoring Systems

The system 100 shown in FIG. 4 also includes a monitoring system that monitors a parameter correlated to a quantity of the first precursor A, the second precursor B, and/or the purge gas P in the gas flow F. The monitoring system, for example, can determine the concentration of the first precursor A, the second precursor B, and/or the purge gas P at different times of the $A_x$-purge-$B_y$-purge pulses in a cycle. The data generated by the monitoring system can be used to control the pulse length of the first precursor A, the second precursor B, and/or the purge gas P to more consistently produce uniform layers on the workpiece W or increase the throughput of workpieces through the reaction chamber 120.

One embodiment of a monitoring system for the system 100 includes a radiation source 182 that directs radiation through at least a portion of the gas flow F. As shown in FIG. 4, for example, the radiation source 182 can direct a measurement beam 183a through the reaction chamber 120 at a location between the gas distributor 160 and the workpiece W. The radiation source 182 can also direct a reference beam 183b so that it is not affected by the gas flow F flowing through the reaction chamber 120. It will be appreciated that not all of the embodiments of the radiation source 182 will require a reference beam 183b. The monitoring system can also include a primary detector 184 that receives the measurement beam 183a and a reference detector 186 that receives the reference beam 183b. The primary detector 184 generates a first signal corresponding to a parameter of the measurement beam 183a, such as the intensity of one or more wavelengths of radiation. Similarly, the reference detector 186 generates a second signal corresponding to the intensity or another parameter of the reference beam 183b. The primary detector 184 and the reference detector 186 are coupled to a comparator 188 that compares the first signal from the primary detector 84 with the second signal from the reference detector 186. The comparator 188 then generates a measurement signal based upon the inputs from the primary detector 184 and the reference detector 188.

The radiation source 182 and the primary detector 184 can be configured to monitor a particular wavelength of radiation that is affected by the presence of a particular gas. For example, the radiation source 182 can emit a radiation that is absorbed by one of the first precursor A, the second precursor B, or the purge gas P. In one embodiment, the radiation source 182 emits a bandwidth of radiation having a spectrum of wavelengths and the primary detector 184 can include a filter that detects the presence of one or more wavelengths that are affected by the presence of the gases. The radiation source 182, for example, can generate a sufficiently wide spectrum of radiation to include wavelengths that are affected by each of the first precursor A, the second precursor B, and the purge gas P; the primary detector 184 can accordingly include separate filters that monitor the intensity of the individual wavelengths affected by each of the first precursor A, the second precursor B, and the purge gas P. In another embodiment, the radiation source 182 includes individual emitters that emit specific wavelengths or narrow bandwidths of radiation including a first radiation having a first wavelength affected by the first precursor A, and second radiation having a second wavelength affected by the second precursor B, and a third radiation having a third wavelength affected by the third precursor P. It will be appreciated that several other types of radiation sources and detectors can be used. Suitable radiation sources and detectors are manufactured by INUSA or Online Technologies.

The monitoring system provides real-time data that is correlated to the quantity of the particular constituents in the reaction chamber 120. For example, as the individual gases flow in the gas flow F, the primary detector 184 measures the change in intensity of the measurement beam 183a as it changes in correlation to the quantity of the individual gases in the gas flow F. As explained above, the comparator 188 uses the first signal from the primary detector 184 to generate a measurement signal that provides an indication of the quantity of the first precursor A, the second precursor B, and/or the purge gas P in the reaction chamber or another portion of the gas flow F.

The controller 142 receives the signals from the comparator 188 and sends control signals to the valve assembly 133. The control signals from the controller 142 cause the valve assembly 133 to adjust the pulse length of the purge pulses and/or the precursor pulses. The controller 142 accordingly contains computer operable instructions, such as software and/or hardware, that carry out embodiments of methods in accordance with the invention for controlling the pulse width of the various gases. In general, the computer operable instructions adjust the pulse width of the purge pulses and/or the precursor pulses based on the measurement signals correlated to the quantity of the first precursor A, the second precursor B, and/or the purge gas P in the gas flow F in real-time during the deposition cycle of a workpiece W. The controller 142 can accordingly adjust the pulse width for one or more the gases during the deposition cycle to compensate for variances in the processing of an individual workpiece and to increase the throughput of an ALD process.

C. Deposition Methods

Figure 5:
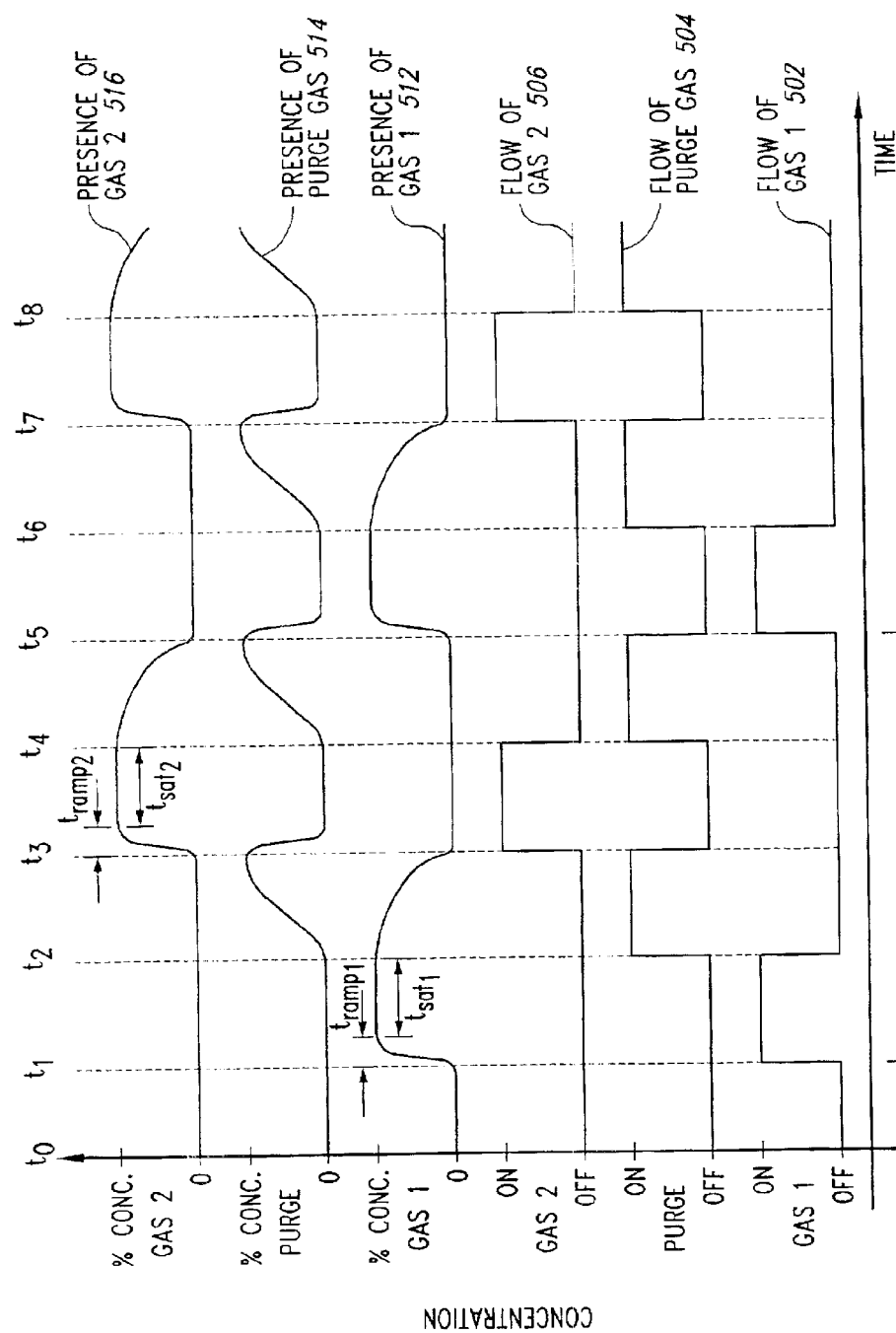
FIG. 5 is a timing chart illustrating several aspects of methods for depositing materials onto micro-device workpieces in accordance with embodiments of the invention.

FIG. 5 is a timing diagram illustrating the individual flows of the first precursor A (labeled as Gas 1), the second precursor B (labeled as Gas 2), and the purge gas (labeled as Purge Gas) through the valve assembly 133 (FIG. 4). The lower three lines show the on/off configuration of the valve assembly 133. FIG. 5 also shows the quantity of the individual gases in the reaction chamber or in the gas flow F downstream from the outlet. For example, the upper three lines show the presence of the individual gases in the reaction chamber relative to the on/off cycling of the valve assembly 133.

The quantity of the precursors A and B fluctuates from zero to a saturation level throughout the cycles. Referring to FIG. 5, at time $t_1$ the valve assembly 133 turns on the flow of the first precursor A shown by line 502. The quantity of the first precursor A increases for a ramp time $t_{ramp1}$ until the quantity or concentration of the first precursor A reaches a desired saturation level. The flow of the first precursor A through the valve assembly 133 continues for a saturation period $t_{sat1}$ until a time $t_2$. The period from $t_1$ to $t_2$ defines one pulse of the first precursor A. At time $t_2$, the valve assembly 133 turns off the flow of the first precursor A (line 502) and turns on the flow of the purge gas P (line 504). The presence of the first precursor A accordingly decreases (line 512) while the presence of the purge gas P accordingly increases (line 514) until a time $t_3$ defining the endpoint of the purge pulse. At time $t_3$, the valve assembly 133 turns off the flow of the purge gas P (line 504), and turns on the flow of the second precursor B (line 506). The presence of the purge gas P decreases (line 514) while the presence of the second precursor B increases during a ramp time $t_{ramp2}$. The pulse of the second precursor B continues for a saturation time $t_{sat2}$ until time $t_4$. The period from $t_3$ to $t_4$ defines one pulse of the second precursor B. At time $t_4$, the flow of the second precursor B is terminated (line 506) and the flow of the purge gas P is reinitiated (line 504) such that the presence of the second precursor decreases (line 516) while the presence of the purge gas P increases (line 514) between time $t_4$ and time $t_5$. The cycle of pulses from time $t_1$ to $t_5$ is then repeated for as many cycles as are necessary to form a layer of material having a desired thickness.

One aspect of certain embodiments of methods in accordance with the invention is controlling the duration of the precursor pulses for at least one of the first precursor A or the second precursor B. Referring to FIGS. 4 and 5 together, the radiation source 182 and the primary detector 184 can be configured to detect the concentration of the first precursor A. At time $t_1$ shown in FIG. 5, therefore, the comparator 188 generates measurement signals corresponding to the increase in the concentration of the first precursor A during the ramp time $t_{ramp}$. When the measurement signal from the comparator 188 is at a predetermined value corresponding to a desired concentration of the precursor A, or when the slope of the change in the measurement signal indicates that the ramp rate of the first precursor A is relatively low, then the controller 142 can set the duration of the pulse of the first precursor A to continue for an additional time period of $t_{sat1}$. The time period $t_{sat1}$ can be a predetermined value that is programmed into the controller 142. The saturation period $t_{sat1}$, for example, can be determined using empirical studies. It will be appreciated that the ramp time $t_{ramp1}$ may vary throughout a run of workpieces because of adsorption/desorption of the precursor in the reaction chamber 120. The controller 142 can accordingly set the overall duration of the precursor pulse between time $t_1$ and $t_2$ to equal the measured ramp time $t_{ramp1}$ plus the predetermined saturation time $t_{sat1}$. A similar process can be performed for controlling the duration of the pulse of the second precursor B between time $t_3$ and $t_4$ by configuring the radiation source 182 and the primary detector 184 to measure the quantity of the second precursor B.

The system 100 can accordingly control the duration of the precursor pulses in real-time during a processing cycle for a workpiece. This is expected to provide more uniform layers on workpieces because it inherently compensates for adsorption and desorption of the precursors. For example, if the precursors are adsorbing to the surfaces of the reaction chamber, the ramp time to bring the concentration of the precursors to a desired level will increase because some molecules of the precursors will be extracted from the gas flow F before reaching the workpiece W. The controller 142 compensates for adsorption of the precursors by increasing the pulse width in real time according to the measured ramp time. Conversely, if the precursors are desorping from surfaces of the reaction chamber 120, then the controller 142 will indicate a shorter ramp time and a corresponding shorter pulse width. Therefore, the system 100 and methods for controlling the duration of the precursor pulses are expected to provide real-time control of individual pulses of one or more of the precursors in a manner that is expected to produce more uniform layers on the workpieces.

Another aspect of other embodiments of methods for depositing a layer of material onto a workpiece are directed toward controlling the duration of the purge pulses. In one embodiment, the radiation source 182 and primary detector 184 are configured to detect the presence of the purge gas P. In this embodiment, the comparator 188 sends measurement signals to the controller 142 corresponding to the increase in the purge gas P shown by line 514 of FIG. 5. When the purge gas P reaches a desired concentration and/or the slope of the increase of the purge gas P is relatively low, then the controller 142 terminates the purge cycle and begins a precursor cycle (e.g., at time $t_3$, $t_5$ and $t_7$). In another embodiment, the purge cycle is terminated by monitoring the presence of one or more of the precursors. The controller 142 terminates the purge pulses when the presence of a precursor falls below a desired level or the slope of the lines corresponding to the precursor concentration (e.g., lines 512 and 516 in FIG. 5) is at a desired value. The pulse widths of the purge pulses can also be terminated using a combination of the presence of the precursor gas P and the first precursor A or second precursor B.

The controller 142 can accordingly adjust the length of the purge cycles to purge enough of the precursors from the reaction chamber without unnecessarily continuing the duration of the purge pulses. This is expected to provide better control over the deposition process in a manner that is likely to increase throughput and enhance the uniformity of the deposited layers. For example, conventional technology for setting the endpoint of purge pulses involves determining a pulse width using empirical studies. This is typically accomplished in conventional systems by starting with long purge times, and then reducing the length of the purge times until an adequate amount of each of the precursors is purged from the reaction chamber. This is a time consuming process, and it may not produce accurate results because of the adsorption and desorption of the gases during a run of workpieces may change the necessary duration of the purge pulses. The system 100 is expected to resolve these problems because the pulse width of the purge pulses are controlled in real-time to reduce the duration of the purge pulses in a manner that compensates for both adsorption and desorption during a run of workpieces. Therefore, several embodiments of methods for operating the system 100 are useful for enhancing the throughput of workpieces and the uniformity of deposited layers.

D. Additional Embodiments of Deposition Systems

Figure 6:
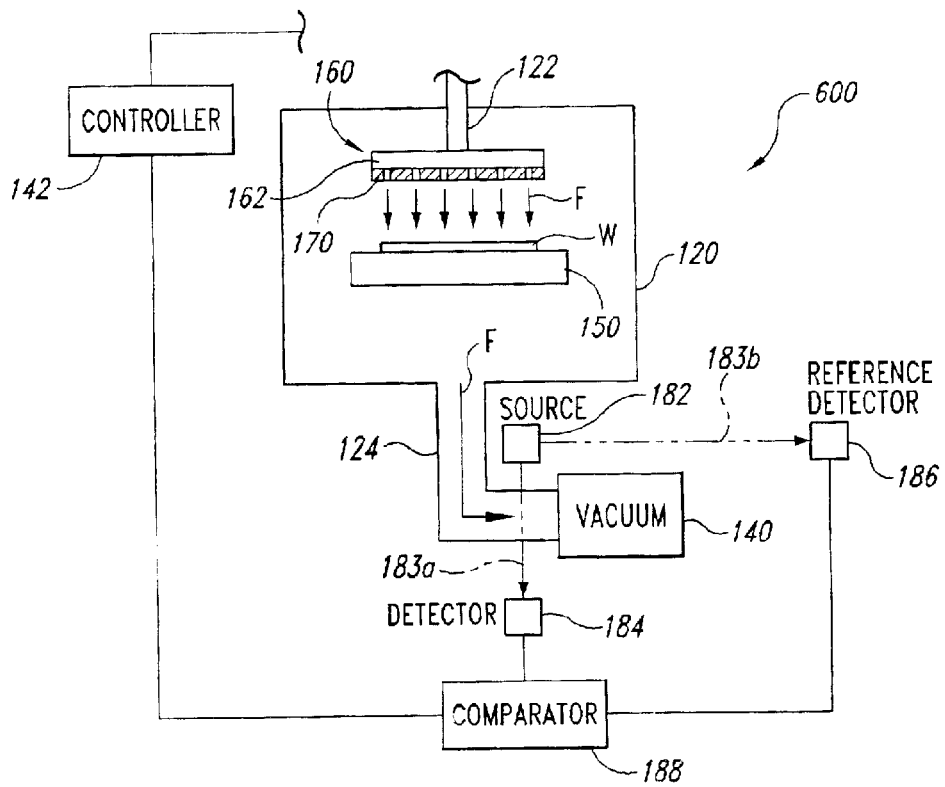
FIG. 6 is a schematic representation of a system having a reactor for depositing material onto a micro-device workpiece in accordance with yet another embodiment of the invention.
Figure 7:
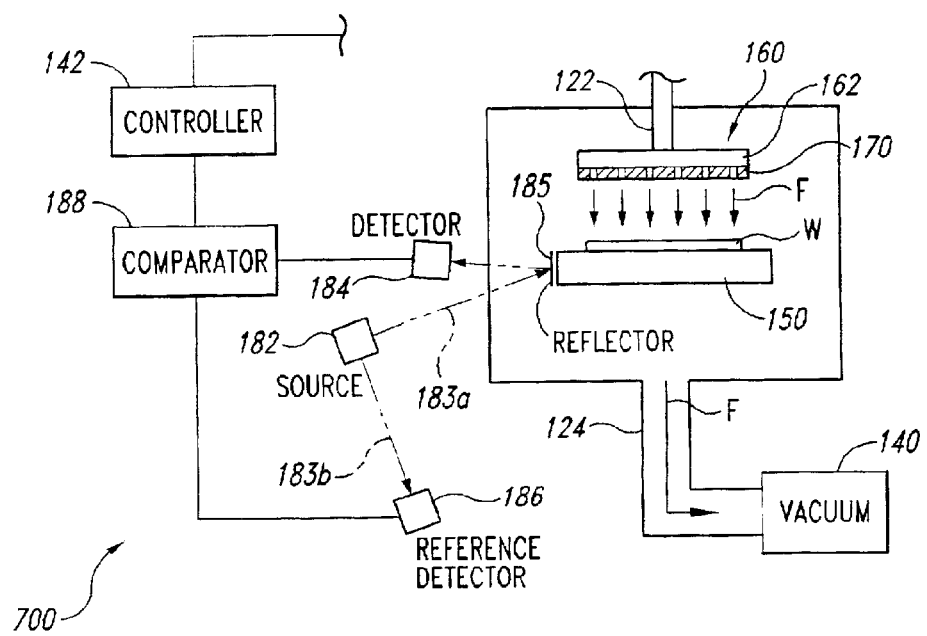
FIG. 7 is a schematic representation of a system having a reactor for depositing material onto a micro-device workpiece in accordance with still another embodiment of the invention.
Figure 8:
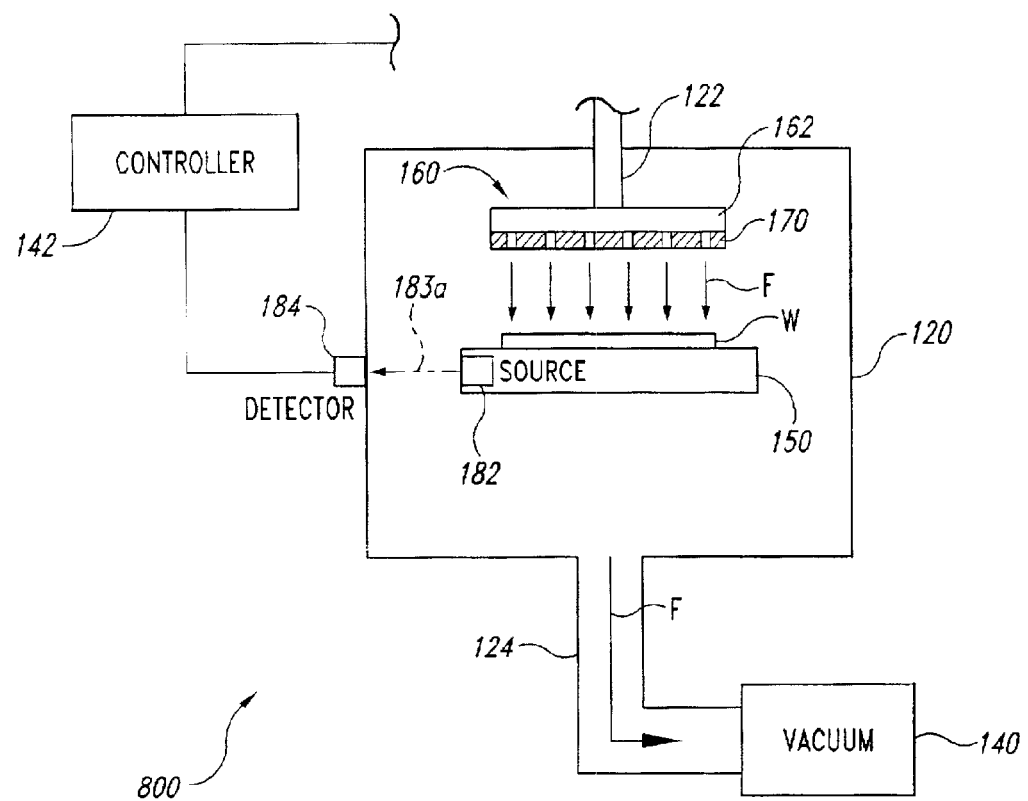
FIG. 8 is a schematic representation of a system having a reactor for depositing material onto a micro-device workpiece in accordance with another embodiment of the invention.

FIGS. 6–8 are schematic diagrams illustrating additional embodiments of systems in accordance with the invention. Like reference numbers refer to like components in FIGS. 4 and 6–8. FIG. 6 illustrates a system 600 in which the monitoring system includes a radiation source 182 that directs a measurement beam 183*a* through a gas flow F in the outlet 124. The primary detector 184 can be positioned on another side of the outlet 124. FIG. 7 illustrates a system 700 in which the monitoring system further includes a reflector 185 located just downstream from the workpiece W. The reflector 185 can be a mirror or another type of device that does not alter the measurement beam 183*a* other than to change its direction. The reflector 185, for example, can be mounted to the workpiece support 150. The radiation source 182 and the primary detector 184 in the system 700 are configured to use the reflector 185 to direct the measurement beam 183*a* from the radiation source 182 to the primary detector 184. FIG. 8 illustrates a system 800 in which the radiation source 182 is mounted to the workpiece holder 150 in the reaction chamber 120. The radiation source 182 in the system 800 directs the measurement beam 183*a* to the primary detector 184. In this embodiment, the monitoring system does not include a reference detector 186 or a comparator 188. Instead, the detector 184 sends a measurement signal directly to the controller 142. It will be appreciated that the controller 142 can include the hardware for receiving and processing the measurement signal from the detector 184.

From the foregoing, it will be appreciated that specific embodiments of the invention have been described herein for purposes of illustration, but that various modifications may be made without deviating from the spirit and scope of the invention. For example, although the foregoing description describes several embodiments as having two precursors, it will be appreciated that the invention includes embodiments having more than two precursors. Additionally, it will be appreciated that the same purge gas can be used between precursor pulses, or that pulses of different purge gases can be used for purging different types of precursors. For example, an embodiment can use a pulse of a first purge gas after a pulse of the first precursor and then a pulse of a second purge gas after a pulse of the second precursor; the first and second purge gases can be different gases. Accordingly, the invention is not limited except as by the appended claims.

We claim:

1. A method for depositing materials onto a micro-device workpiece in a reaction chamber, comprising:

providing a flow of a first precursor through the reaction chamber to deposit the first precursor onto a micro-device workpiece in the reaction chamber;

providing a flow of a purge gas through the reaction chamber to purge excess amounts of the first precursor;

monitoring a parameter correlated to a quantity of the first precursor and/or the purge gas in the reaction chamber as the first precursor and/or the purge gas flow through the reaction chamber; and terminating the flow of the first precursor and/or the flow of the purge gas based on the monitored parameter of the quantity of the first precursor and/or the purge gas.

2. The method of claim 1 wherein monitoring a parameter correlated to a quantity of the first precursor and/or the purge gas comprises determining a concentration of the first precursor and/or the purge gas in the reaction chamber.

3. The method of claim 1 wherein monitoring a parameter correlated to a quantity of the first precursor and/or the purge gas comprises determining a concentration of the first precursor and/or the purge gas in the reaction chamber by directing a selected radiation through the reaction chamber and detecting a change in the radiation.

4. The method of claim 1 wherein monitoring a parameter correlated to a quantity of the first precursor and/or the purge gas comprises directing a selected radiation through the reaction chamber that is absorbed by the first precursor, detecting an intensity of the selected radiation, and indicating a quantity of the first precursor in the reaction chamber based on the detected intensity of the selected radiation.

5. The method of claim 1 wherein monitoring a parameter correlated to a quantity of the first precursor and/or the purge gas in the reaction chamber comprises directing a selected radiation through the reaction chamber that is absorbed by the purge gas, detecting an intensity of the selected radiation, and indicating a quantity of the purge gas in the reaction chamber based on the detected intensity of the selected radiation.

6. The method of claim 1 wherein:

providing a flow of the first precursor comprises injecting a pulse of the first precursor into the reaction chamber;

monitoring a parameter correlated to a quantity of the first precursor and/or the purge gas comprises determining a concentration of the first precursor in the reaction chamber during the pulse of the first precursor and detecting when the concentration of the first precursor increases to a desired level; and the method further comprises terminating the pulse of the first precursor at a predetermined period of time after the concentration of the first precursor reaches the desired level.

7. The method of claim 1 wherein:

providing a flow of the purge gas comprises injecting a pulse of the purge gas into the reaction chamber;

monitoring a parameter correlated to a quantity of the first precursor and/or the purge gas comprises determining a concentration of the first precursor in the reaction chamber during the pulse of the purge gas; and the method further comprises terminating the pulse of the purge gas when the concentration of the first precursor decreases to an acceptable level for introducing a second precursor into the reaction chamber.

8. The method of claim 1 wherein:

providing a flow of the purge gas comprises injecting a pulse of the purge gas into the reaction chamber;

monitoring a parameter correlated to a quantity of the first precursor and/or the purge gas comprises determining a concentration of the purge gas in the reaction chamber during the pulse of the purge gas; and the method further comprises terminating the pulse of the purge gas when the concentration of the purge gas increases to an acceptable level for introducing a second precursor into the reaction chamber.

9. The method of claim 1 wherein monitoring a parameter correlated to a quantity of the first precursor and/or the purge gas comprises determining a concentration of the first precursor and/or the purge gas by directing a selected radiation through the flow of the first precursor and/or the flow of the purge gas upstream relative to the workpiece.

10. The method of claim 1 wherein monitoring a parameter correlated to a quantity of the first precursor and/or the purge gas comprises determining a concentration of the first precursor and/or the purge gas by directing a selected radiation through the flow of the first precursor and/or the flow of the purge gas downstream relative to the workpiece.

11. A method for depositing materials onto a micro-device workpiece in a reaction chamber, comprising:
providing a flow of a first precursor through the reaction chamber to deposit the first precursor onto a micro-device workpiece;
providing a flow of a purge gas through the reaction chamber to purge excess amounts of the first precursor;
determining a concentration of the first precursor and/or the purge gas in the reaction chamber as the first precursor and/or the purge gas flow through the reaction chamber; and
terminating the flow of the first precursor and/or the flow of the purge gas based on the determined concentration of the first precursor or the purge gas.

12. The method of claim 11 wherein determining a concentration of the first precursor and/or the purge gas comprises directing a selected radiation through the reaction chamber and detecting a change in the radiation.

13. The method of claim 11 wherein determining a concentration of the first precursor and/or the purge gas comprises directing a selected radiation through the reaction chamber that is absorbed by the first precursor, detecting an intensity of the selected radiation, and indicating a quantity of the first precursor in the reaction chamber based on the detected intensity of the selected radiation.

14. The method of claim 11 wherein determining a concentration of the first precursor and/or the purge gas comprises directing a selected radiation through the reaction chamber that is absorbed by the purge gas, detecting an intensity of the selected radiation, and indicating a quantity of the purge gas in the reaction chamber based on the detected intensity of the selected radiation.

15. The method of claim 11 wherein:
providing a flow of the first precursor comprises injecting a pulse of the first precursor into the reaction chamber;
determining a concentration of the first precursor and/or the purge gas comprises determining a concentration of the first precursor in the reaction chamber during the pulse of the first precursor and detecting when the concentration of the first precursor increases to a desired level; and
the method further comprises terminating the pulse of the first precursor at a predetermined period of time after the concentration of the first precursor reaches the desired level.

16. The method of claim 11 wherein:
providing a flow of the purge gas comprises injecting a pulse of the purge gas into the reaction chamber;
determining a concentration of the first precursor and/or the purge gas comprises determining a concentration of the first precursor in the reaction chamber during the pulse of the purge gas; and the method further comprises terminating the pulse of the purge gas when the concentration of the first precursor decreases to an acceptable level for introducing a second precursor into the reaction chamber.

17. The method of claim 11 wherein:
providing a flow of the purge gas comprises injecting a pulse of the purge gas into the reaction chamber;
determining a concentration of the first precursor and/or the purge gas comprises determining a concentration of the purge gas in the reaction chamber during the pulse of the purge gas; and
the method further comprises terminating the pulse of the purge gas when the concentration of the purge gas increases to an acceptable level for introducing a second precursor into the reaction chamber.

18. A method for depositing materials onto a micro-device workpiece in a reaction chamber, comprising:
providing a flow of a first precursor through the reaction chamber to deposit the first precursor onto a micro-device workpiece;
monitoring a parameter related to the quantity of the first precursor in the reaction chamber during the flow of the first precursor to determine when the quantity of the first precursor has reached a desired level;
terminating the flow of the first precursor at a predetermined period of time after the quantity of the first precursor reaches the desired level; and
providing a flow of a purge gas through the reaction chamber to purge excess amounts of the first precursor.

19. The method of claim 18 wherein monitoring a parameter related to the quantity of the first precursor comprises determining a concentration of the first precursor in the reaction chamber.

20. The method of claim 18 wherein monitoring a parameter related to the quantity of the first precursor comprises directing a radiation having a wavelength absorbed by the first precursor through the reaction chamber and detecting a change in intensity of the radiation.

21. The method of claim 18, further comprising generating a signal that the quantity of the first precursor has reached the desired level when the monitored parameter has increased to a predetermined value corresponding to an end of a ramp time of a pulse of the first precursor.

22. The method of claim 18, further comprising generating a signal that the quantity of the first precursor has reached the desired level when a slope of a change in the monitored parameter is at a value corresponding to an end of a ramp time of a pulse of the first precursor.

23. A method for depositing materials onto a micro-device workpiece in a reaction chamber, comprising:
providing a flow of a first precursor through the reaction chamber to deposit the first precursor onto a micro-device workpiece;
determining a concentration of the first precursor in the reaction chamber as the first precursor flows through the reaction chamber by detecting a change in a radiation energy directed through the reaction chamber;
terminating the flow of the first precursor at a predetermined period of time after the detected change in the radiation energy corresponds to a desired concentration of the first precursor in the reaction chamber; and
providing a flow of a purge gas through the reaction chamber to purge excess amounts of the first precursor.

24. The method of claim 23 wherein determining a concentration of the first precursor comprises directing a radiation having a wavelength absorbed by the first precursor through the reaction chamber and detecting a change in intensity of the wavelength absorbed by the first precursor.

25. The method of claim 23, further comprising generating a signal that the quantity of the first precursor has reached the desired level when the concentration of the first precursor has increased to a predetermined value corresponding to an end of a ramp time of a pulse of the first precursor.

26. The method of claim 23, further comprising generating a signal that the quantity of the first precursor has reached the desired level when a slope of a change in the concentration of the first precursor is at a value corresponding to an end of a ramp time of a pulse of the first precursor.

27. A method for depositing materials onto a micro-device workpiece in a reaction chamber, comprising:
providing a flow of a first precursor through the reaction chamber to deposit the first precursor onto a micro-device workpiece;
providing a flow of a purge gas through the reaction chamber to purge excess amounts of the first precursor;
monitoring a parameter related to a quantity of the first precursor and/or the purge gas in the reaction chamber as the purge gas flows through the reaction chamber to determine when a desired amount of the first precursor has been purged from the reaction chamber; and
terminating the flow of the purge gas after determining when a desired amount of the first precursor has been removed from the reaction chamber.

28. The method of claim 27 wherein monitoring a parameter related to the quantity of the purge gas and/or the first precursor comprises determining a concentration of the first precursor in the reaction chamber.

29. The method of claim 27 wherein monitoring a parameter related to the quantity of the purge gas and/or the first precursor comprises directing a radiation having a wavelength absorbed by the first precursor through the reaction chamber and detecting a change in intensity of the radiation.

30. The method of claim 27 wherein monitoring a parameter related to the quantity of the purge gas and/or the first precursor comprises determining a concentration of the purge gas in the reaction chamber.

31. The method of claim 27 wherein monitoring a parameter related to the quantity of the purge gas and/or the first precursor comprises directing a radiation having a wavelength absorbed by the purge gas through the reaction chamber and detecting a change in intensity of the radiation.

32. The method of claim 27, further comprising generating a signal that the first precursor has been purged when a concentration of the first precursor has decreased to a predetermined value corresponding to an end of a purge gas pulse.

33. The method of claim 27, further comprising generating a signal that the first precursor has been purged when a concentration of the purge gas has increased to a predetermined value corresponding to an end of a purge gas pulse.

34. A method for depositing materials onto a micro-device workpiece in a reaction chamber, comprising:
providing a flow of a first precursor through the reaction chamber to deposit the first precursor onto a micro-device workpiece;
providing a flow of a purge gas through the reaction chamber to purge excess amounts of the first precursor;
determining a concentration of the first precursor and/or the purge gas in the reaction chamber as the purge gas flows through the reaction chamber by detecting a change in a radiation energy directed through the reaction chamber; and
terminating the flow of the purge gas when the detected change in the radiation energy corresponds to a desired concentration of the first precursor and/or the purge gas in the reaction chamber.

35. The method of claim 34 wherein determining a concentration of the purge gas and/or the first precursor comprises directing a radiation having a wavelength absorbed by the first precursor through the reaction chamber and detecting a change in intensity of the wavelength absorbed by the first precursor.

36. The method of claim 34 wherein determining a concentration of the purge gas and/or the first precursor comprises directing a radiation having a wavelength absorbed by the purge gas through the reaction chamber and detecting a change in intensity of the wavelength absorbed by the purge gas.

37. A method for depositing materials onto a micro-device workpiece in a reaction chamber, comprising:
providing a flow of a first precursor through the reaction chamber to deposit the first precursor onto a micro-device workpiece;
monitoring a parameter related to the quantity of the first precursor in the reaction chamber as the first precursor flows through the reaction chamber to determine when the quantity of the first precursor has reached a desired level;
terminating the flow of the first precursor at a predetermined period of time after the quantity of the first precursor reaches the desired level;
providing a flow of a purge gas through the reaction chamber to purge excess amounts of the first precursor;
monitoring a parameter related to a quantity of the first precursor and/or the purge gas in the reaction chamber as the purge gas flows through the reaction chamber to determine when a desired amount of the first precursor has been purged from the reaction chamber; and
terminating the flow of the purge gas after determining when a desired amount of the first precursor has been removed from the reaction chamber.

38. A method for depositing materials onto a micro-device workpiece in a reaction chamber, comprising:
providing a flow of a first precursor through the reaction chamber to deposit the first precursor onto a micro-device workpiece;
determining a concentration of the first precursor in the reaction chamber as the first precursor flows through the reaction chamber by detecting a change in a radiation energy directed through the reaction chamber;
terminating the flow of the first precursor at a predetermined period of time after the detected change in the radiation energy corresponds to a desired concentration of the first precursor in the reaction chamber;
providing a flow of a purge gas through the reaction chamber to purge excess amounts of the first precursor;
determining a concentration of the first precursor and/or the purge gas in the reaction chamber as the purge gas flows through the reaction chamber by detecting a change in a radiation energy directed through the reaction chamber; and
terminating the flow of the purge gas when the detected change in the radiation energy corresponds to a desired concentration of the first precursor and/or the purge gas in the reaction chamber.

* * * * *